(12) United States Patent
Kato et al.

(10) Patent No.: US 9,915,482 B2
(45) Date of Patent: Mar. 13, 2018

(54) HEAT SINK, AND METHOD FOR PRODUCING SAME

(75) Inventors: Kenji Kato, Tokyo (JP); Shigetoshi Ipposhi, Tokyo (JP); Toshiki Tanaka, Tokyo (JP); Shinya Motokawa, Tokyo (JP); Toshio Nakayama, Tokyo (JP); Masafumi Ibushi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 472 days.

(21) Appl. No.: 13/700,566

(22) PCT Filed: Mar. 25, 2011

(86) PCT No.: PCT/JP2011/057310
§ 371 (c)(1),
(2), (4) Date: Nov. 28, 2012

(87) PCT Pub. No.: WO2011/155247
PCT Pub. Date: Dec. 15, 2011

(65) Prior Publication Data
US 2013/0081798 A1    Apr. 4, 2013

(30) Foreign Application Priority Data

Jun. 7, 2010    (JP) .................. 2010-129562

(51) Int. Cl.
*F28F 3/04*    (2006.01)
*H01L 23/467*    (2006.01)
(Continued)

(52) U.S. Cl.
CPC .............. *F28F 3/04* (2013.01); *H01L 23/467* (2013.01); *H05K 7/20163* (2013.01); *F28D 2021/0029* (2013.01); *H01L 2924/0002* (2013.01)

(58) Field of Classification Search
CPC ...... H05K 7/20; F28F 7/00; F28F 3/04; H01L 21/67103; H01L 21/67109; H01L 23/467; F28D 2021/0029
(Continued)

(56) References Cited

U.S. PATENT DOCUMENTS 5,930,112 A * 7/1999 Babinski ............... H02M 7/003
361/695
6,237,222 B1    5/2001 Chen
(Continued)

FOREIGN PATENT DOCUMENTS

CN    201281564 Y    7/2009
DE    203 01 910 U1    4/2003
(Continued)

OTHER PUBLICATIONS

JP4007861A—Machine Translation.*
(Continued)

*Primary Examiner* — Len Tran
*Assistant Examiner* — Gustavo Hincapie Serna
(74) *Attorney, Agent, or Firm* — Oblon, McClelland, Maier & Neustadt, L.L.P.

(57) ABSTRACT

A heat sink including a base section, connection fins, and parallel fins. The base section includes: a first base plate configured to be mounted with a heat generating component on its outer surface; a second base plate disposed to face the first base plate in a parallel manner, configured to be mounted with a heat generating component on its outer surface; and a third base plate disposed perpendicular to the first base plate and the second base plate, which secures the first base plate and the second base plate along a junction line. The base section includes first and second regions arranged in the direction of the junction line. The connection fins are disposed on the first region to connect inner surfaces (Continued)

of the first and second base plates and to be parallel to the third base plate, and the parallel fins are disposed on the second region from an inner surface of the third base plate to be parallel to the first base plate.

11 Claims, 14 Drawing Sheets

(51) Int. Cl.
    *H05K 7/20* (2006.01)
    *F28D 21/00* (2006.01)

(58) Field of Classification Search
    USPC ............... 165/80.1, 80.3, 121; 361/697, 704
    See application file for complete search history.

(56) References Cited

U.S. PATENT DOCUMENTS

| | | | | |
|---|---|---|---|---|
| 6,580,608 | B1* | 6/2003 | Searls | H01L 23/3675 165/185 |
| 7,106,589 | B2* | 9/2006 | Kiley | F28D 15/0266 165/104.14 |
| 7,817,421 | B2* | 10/2010 | Nagatomo | H05K 7/20918 165/104.33 |
| 2002/0050333 | A1 | 5/2002 | Ootori et al. | |
| 2003/0188849 | A1 | 10/2003 | Gawve | |
| 2004/0150952 | A1* | 8/2004 | Yu | H05K 7/20154 361/697 |
| 2005/0217824 | A1* | 10/2005 | Sandberg et al. | 165/80.3 |
| 2005/0286226 | A1* | 12/2005 | Ishii et al. | 361/697 |
| 2005/0286231 | A1 | 12/2005 | Kishi | |
| 2007/0144705 | A1* | 6/2007 | Chen et al. | 165/80.3 |
| 2007/0217151 | A1* | 9/2007 | Lin | G06F 1/185 361/697 |
| 2008/0041565 | A1* | 2/2008 | Yang | F28D 15/046 165/104.26 |
| 2009/0065174 | A1* | 3/2009 | Lai et al. | 165/80.3 |
| 2009/0165997 | A1* | 7/2009 | Ma et al. | 165/80.3 |
| 2009/0180251 | A1* | 7/2009 | Biagini et al. | 361/690 |
| 2009/0314465 | A1* | 12/2009 | Zheng et al. | 165/80.3 |
| 2010/0033689 | A1* | 2/2010 | Overmann et al. | 353/61 |
| 2010/0202109 | A1* | 8/2010 | Zheng | H02M 7/003 361/697 |
| 2011/0292594 | A1* | 12/2011 | Carter | G06F 1/20 361/679.49 |

FOREIGN PATENT DOCUMENTS

| | | | | |
|---|---|---|---|---|
| GB | 2 059 569 | A | | 4/1981 |
| JP | 4 7861 | | | 1/1992 |
| JP | 4007861 | A | * | 1/1992 ............... H05K 7/20 |
| JP | 5 36888 | | | 5/1993 |
| JP | 8-37387 | A | | 2/1996 |
| JP | 2000 183573 | | | 6/2000 |
| JP | 2001-85579 | A | | 3/2001 |
| JP | 2006 13027 | | | 1/2006 |
| JP | 3935100 | | | 6/2007 |
| JP | 3947797 | | | 7/2007 |
| JP | 2008 270651 | | | 11/2008 |
| TW | 200708702 | A | | 3/2007 |

OTHER PUBLICATIONS

Office Action and Search Report dated Aug. 28, 2013 in Taiwanese Patent Application No. 100116277.
International Preliminary Report on Patentability dated Jan. 8, 2013 in PCT/JP11/57310 Filed Mar. 25, 2011.
International Search Report dated Jul. 12, 2011 in PCT/JP11/57310 Filed Mar. 25, 2011.
Office Action dated Nov. 4, 2014 in the corresponding Chinese Patent Application No. 201180028042.0 (with English Translation).
Office Action dated Apr. 24, 2015 in Chinese Patent Application No. 201180028042.0 (with English language translation).
German Office Action dated Dec. 21, 2015 in Patent Application No. 11 2011 101 959.9 (with English language translation).
Office Action dated May 4, 2016 in German Patent Application No. 112011101959.9 (with English Translation).
Official Minutes of the Hearing issued Jun. 28, 2016 in German Patent Application No. 112011101959.9 (with English summary).

* cited by examiner

C-C CROSS SECTION

HEAT SINK, AND METHOD FOR PRODUCING SAME

TECHNICAL FIELD

The present invention relates to a heat sink and a method for producing the heat sink and particularly to a heat sink for cooling a plurality of heat generating components and a method for producing the heat sink.

BACKGROUND ART

In a prior-art heat sink, if there are a plurality of heat generating components, the heat generating components are respectively mounted to two base plates disposed parallel, side surfaces of the two base plates are thermally connected by another member for connection, and fins are provided to the respective base plates to carry out cooling of the heat generating components (e.g., Patent Document 1).

Patent Document 1: Japanese Patent Application Laid-Open No. 2008-270651

DISCLOSURE OF THE INVENTION

Problem to be Solved by the Invention

In the prior-art heat sink, the side surfaces of the base plates mounted with the heat generating components are thermally connected by the connection member and heat transfer is carried out between the two base plates. Because the two base plates are connected at only one position in this manner, it is impossible to carry out sufficient heat transfer and cooling of the heat generating component generating a larger amount of heat is insufficient when there is a large difference between amounts of heat generation of the two heat generating components.

Therefore, it is an object of the present invention to provide a heat sink for cooling a plurality of heat generating components and capable of efficiently cooling the respective heat generating components, even if there is a difference between amounts of heat generation of the heat generating components.

Means for Solving the Problem

An aspect of the present invention is a heat sink in which heat-releasing fins are provided to a base section, the heat sink including:

a base section having a) a first base plate which has an outer surface and an inner surface and which is capable of being mounted with a heat generating component on the outer surface, b) a second base plate which is disposed so as to face the first base plate in a parallel manner, has an outer surface and an inner surface, and is capable of being mounted with a heat generating component on the outer surface, and c) a third base plate which is disposed so as to be perpendicular to the first base plate and the second base plate, secures the first base plate and the second base plate along junction lines, and has an outer surface and an inner surface, the base section also having a first region and a second region which are arranged in a direction of the junction lines;

the connection fin disposed in the first region so as to connect the inner surfaces of the first base plate and the second base plate and so as to be parallel to the third base plate; and the parallel fin disposed in the second region so as to extend from the inner surface of the third base plate to be parallel to the first base plate.

An aspect of the present invention is a method for producing a heat sink including the steps of:

preparing a casting mold corresponding to the heat sink including a base section having a) a first base plate which has an outer surface and an inner surface and which is capable of being mounted with a heat generating component on the outer surface, b) a second base plate which is disposed so as to face the first base plate in a parallel manner, has an outer surface and an inner surface, and is capable of being mounted with a heat generating component on the outer surface, and c) a third base plate which is disposed so as to be perpendicular to the first base plate and the second base plate, secures the first base plate and the second base plate along junction lines, and has an outer surface and an inner surface, the base section also having a first region and a second region which are arranged in a direction of the junction lines, a connection fin disposed in the first region so as to connect the inner surfaces of the first base plate and the second base plate and so as to be parallel to the third base plate, and a parallel fin disposed in the second region so as to extend from the inner surface of the third base plate to be parallel to the first base plate;

pouring molten heat conducting material into the casting mold;

cooling and solidifying the heat conducting material to form the heat sink; and taking the heat sink out of the casting mold, wherein the casting mold includes two partial casting molds separated between the first region and the second region of the base section and along a plane perpendicular to the junction lines and the two partial casting molds are separated by moving the partial casting molds in the direction of the junction lines to take the heat sink out of the casting mold.

Effects of the Invention

With the heat sink according to the present invention, it is possible to enhance cooling efficiency of the heat generating components provided on the heat sink.

With the method for producing the heat sink according to the present invention, it is possible to reduce the number of steps in producing the heat sink to thereby reduce production cost.

Figure 1:
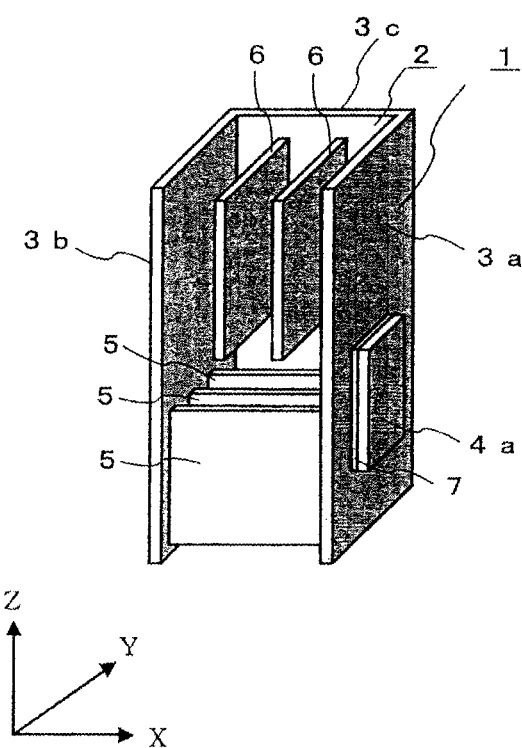
FIG. 1 is a perspective view of a heat sink according to Embodiment 1 of the present invention.

EXPLANATION OF REFERENCE NUMERALS 1 heat sink, 2 base section, 3a first base plate, 3b second base plate, 3c third base plate, 3d fourth base plate, 4a, 4b, 4c, 4d heat generating component, 5 connection fin, 6 parallel fin, 7 heat conducting material, 8 cooling air, 9 cooling fan, 10 electronic component, 12 screw, 13 mounting plate, 15 case, 16 coupling plate, 17 fixing plate, 18 ventilating inlet, 19 ventilating outlet, 20 board positioning boss, 21 board fixing screw hole, 22 fan positioning boss, 23 fan fixing screw hole, 24 fan cover lug fixing hole, 25 heat sink fixing hole, 26 heat generating component mounting screw hole, 27 resin cover lug fixing hole, 28 wiring passage, 29 connection fin outlet, 30 parallel fin inlet, 31 parallel fin outlet, 32 resin cover fixing lug 32, 33 connection fin inlet

BEST MODES FOR CARRYING OUT THE INVENTION

Embodiment 1

Figure 2:
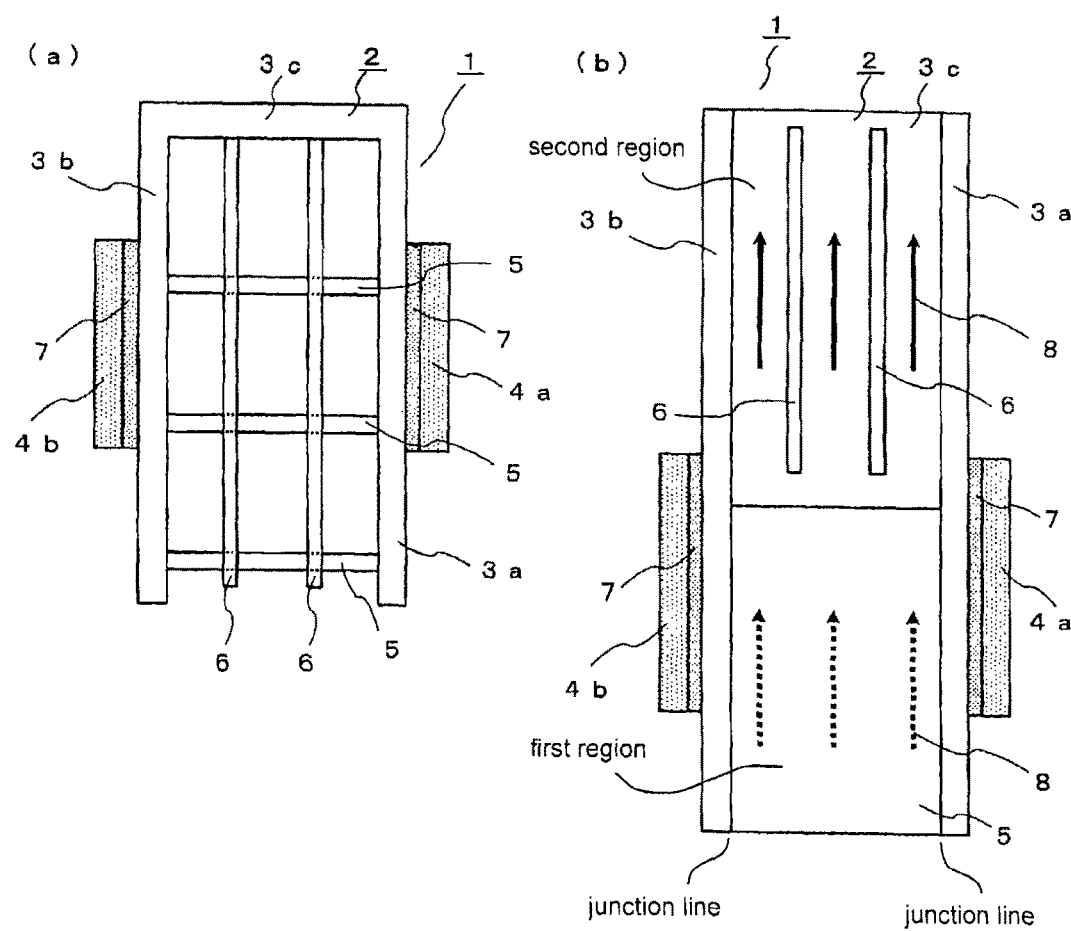
FIGS. 2(a) and 2(b) are plan views of the heat sink according to Embodiment 1 of the present invention.

FIG. 1 is a perspective view of a heat sink according to Embodiment 1 of the present invention, the entire heat sink designated by reference numeral 1. FIG. 2 is a plan view of the heat sink 1, wherein FIG. 2(a) is a view in a direction of a Z-axis (from above) in FIG. 1 and FIG. 2(b) is a view in a direction of a Y-axis in FIG. 1, respectively.

As shown in FIG. 1, the heat sink 1 includes abase section 2 made of aluminum, for example. The base section 2 is formed by a first base plate 3a and a second base plate 3b disposed so as to face each other in a parallel manner and a third base plate 3c connecting the first base plate 3a and the second base plate 3b along junction lines (e.g., a line in the direction of the Z-axis where the first base plate 3a and the third base plate 3c are connected). The three base plates 3a, 3b, and 3c are connected in an angular U shape when seen in the direction of the Z-axis in FIG. 1.

Inside the base section 2 (a first region), connection fins 5 are provided (in XZ planes) to connect the first base plate 3a and the second base plate 3b facing each other and to be parallel to the third base plate 3c. Moreover, parallel fins 6 parallel to the first base plate 3a and the second base plate 3b and orthogonal (in YZ planes) to the connection fins 5 are provided to the third base plate 3c of the base section 2 (a second region). The connection fins 5 and the parallel fins 6 are made of aluminum, for example.

Although the three connection fins 5 and the two parallel fins 6 are provided in FIGS. 1 and 2, the number of fins may be one or more. An arrangement of the fins is not limited to that in FIGS. 1 and 2. The connection fins 5 may be provided in upper positions and the parallel fins 6 may be provided in lower positions.

On outer sides of the first base plate 3a and the second base plate 3b of the base section 2, heat generating components 4a and 4b such as power transistors are respectively mounted with heat conducting materials 7 interposed therebetween. As the heat conducting materials 7, thermal grease, thermal sheets, or the like is (are) used. The heat generating components 4a and 4b are preferably disposed so that at least parts of them overlap the connection fins 5 when seen in a direction of an X-axis.

Although the heat generating components 4a and 4b are provided to the first base plate 3a and the second base plate 3b, one component on each plate, in FIGS. 1 and 2, only one heat generating component may be provided to one of the plates or two or more heat generating components may be provided to each of the plates.

In this heat sink 1, heat generated by the heat generating components 4a and 4b is transferred from the base section 2 to the connection fins 5 or the parallel fins 6. Air around the connection fins 5 and the parallel fins 6 is warmed by the transferred heat and an air density difference generates cooling air 8 flowing upward from below as shown in FIG. 2. With this cooling air 8, the base section 2, the connection fins 5, and the parallel fins 6 are cooled and the heat generating components 4a and 4b are cooled.

Because the parallel fins 6 are provided above the connection fins 5 in the heat sink 1, it is possible to improve a heat-releasing characteristic by anterior border effect at an inlet portion of the parallel fins 6 (a portion below the parallel fins 6).

Although a heat sink in which straight fins are offset and disposed parallel at regular intervals is used in prior art in order to obtain the anterior border effect, an air inflow width at a fin inlet is narrow at the offset portion and a high-speed portion of air flowing out of the preceding fins collides with lower surfaces of the subsequent fins to thereby increase flow resistance.

In the heat sink 1 according to Embodiment 1, on the other hand, the connection fins 5 and the parallel fins 6 are disposed so that their normals are orthogonal to each other and therefore an air inlet width from an outlet of the connection fins 5 into the inlet of the parallel fins 6 is large. Moreover, because not only a high-speed portion but also a low-speed portion of the air flowing out of the preceding fins (connection fins 5) collide with the lower surfaces of the subsequent fins (parallel fins 6), it is possible to reduce the flow resistance. As a result, it is possible to increase a ventilation amount as compared with that in the prior art to thereby enhance cooling efficiency.

In the structure in which the two heat sinks are simply opposed to each other and one ends of them are connected as in the prior art (e.g., Patent Document 1), if a difference between the amounts of heat generation of the plurality of mounted heat generating components is large, the heat generated by the heat generating component which generates the large amount of heat needs to be transferred through a connection plate to the opposed base plates and fins through long heat transfer routes, which reduces cooling efficiency.

On the other hand, in the heat sink 1 according to Embodiment 1, the first base plate 3a and the second base plate 3b mounted with the heat generating components 4a and 4b and facing each other are thermally connected by the third base plate 3c as well as by the connection fins 5 and the heat transfer routes are shorter than those in the prior-art structure. Therefore, if the difference between the amounts of heat generation of the two heat generating components 4a and 4b is large, heat is automatically balanced by the third base plate 3c and the connection fins 5 and it is possible to improve the heat-releasing characteristic.

For example, if the amount of heat generation of the heat generating component 4a mounted to the first base plate 3a is large, larger areas of the third base plate 3c and the connection fins 5 contribute to release of the heat of the heat generating component 4a and smaller areas of them contribute to release of the heat of the heat generating component 4b. As a result, the temperatures are balanced and it is possible to suppress temperature rise of the heat generating component 4a.

A box-shaped straight heat sink which is produced by extruding aluminum and in which connection fins 5 are disposed from top to bottom along entire surfaces of a base section requires additional working such as boring for mounting components or needs to be combined with other die-cast components, which complicates a production process. Moreover, if a similar box-shaped heat sink is produced by aluminum die casting, molds are pulled off from above and below and therefore burrs are formed at central portions of the fins and it is difficult to remove the burrs. Furthermore, in the die casting, draft angles for the molds are necessary. Therefore, the longer the fins in a ventilating direction, the narrower the openings of the fin outlets become, which increases a pressure loss and reduces an air volume.

On the other hand, the heat sink 1 according to the embodiment 1 can be produced by the die casting in which casting molds are pulled off from two directions and holes for mounting the components can be formed simultaneously, which makes a production process easy. To put it concretely, in producing the heat sink 1 in FIG. 1, for example, casting is carried out by using metal molds which are separated between the lower portion (the first region) provided with the connection fins 5 and the upper portion (the second region) provided with the parallel fins 6. In the casting step, the holes for mounting the components and the like are formed simultaneously. After the casting, by respectively pulling off the two metal molds in the upward direction and the downward direction (the direction of junction lines: the direction of the Z-axis), it is possible to take out the heat sink 1. Alternatively, the upper metal mold (for the second region) may be pulled off forward (in the direction perpendicular to the junction lines: the direction of the Y-axis) and the lower metal mold (in the first region) may be pulled off downward (in the direction of the junction lines: the direction of the Z-axis).

If the heat sink 1 is produced by the die casting, the three base plates 3a, 3b, and 3c are formed integrally and therefore it is possible to maintain a clearance between the two base plates 3a and 3b with high rigidity. If the upper portion (first region) and the lower portion (second region) are produced as separate components and stacked, the number of steps in the production process increases and components for connection become necessary to increase production cost. Therefore, by pulling off the molds in the two directions and integrally forming the upper portion and the lower portion, it is possible to reduce the cost. Moreover, even if burrs are formed during the production process of the die casting, there is a space between the connection fins 5 and the parallel fins 6 and therefore it is possible to easily remove the burrs. If the connection fins 5 are formed along the entire surfaces of the heat sink 1 by the die casting, the outlets become narrow due to the draft angles for the molds. However, by providing the two types of fins, i.e., the connection fins 5 and the parallel fins 6, the openings of the fin outlets are not excessively narrow and a ventilating characteristic is not impaired.

Embodiment 2

Figure 3:
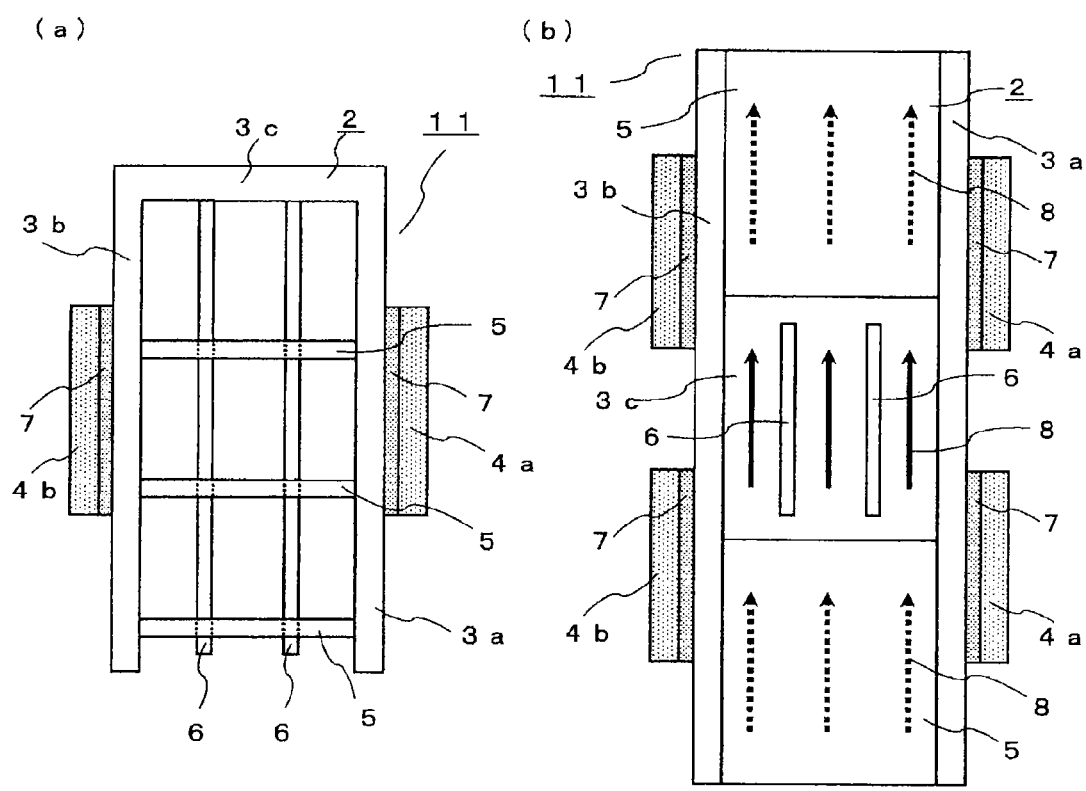
FIGS. 3(a) and 3(b) are plan views of a heat sink according to Embodiment 2 of the present invention.

FIG. 3 is a plan view of a heat sink 11 according to Embodiment 2 of the present invention, wherein FIG. 3(a) is a view in a direction of a Z-axis (from above) in FIG. 1 and FIG. 3(b) is a view in a direction of a Y-axis in FIG. 1, respectively. In FIG. 3, the same reference numerals as those in FIGS. 1 and 2 designate the same or corresponding portions.

As shown in FIG. 3, in the heat sink 11 according to Embodiment 2, connection fins 5 are provided in two sections. As heat-releasing fins, the connection fins 5, parallel fins 6, and the connection fins 5 are provided in this order from bottom. In other words, the connection fins 5 are provided additionally to the upper portion of the heat sink 1 in Embodiment 1.

In such a heat sink 11, if the number of heat generating components 4a and 4b mounted to the base section 2 is large, the connection fins 5 are provided near the respective heat generating components 4a and 4b to connect the first base plate 3a and the second base plate 3b as shown in FIG. 3(b). Even if a difference between amounts of heat generation of the heat generating components 4a and 4b is large, heat equalizing effect is large and it is possible to improve a heat-releasing characteristic. The heat generating components 4a and 4b are preferably disposed so that at least parts of them overlap the connection fins 5 when seen in a direction of an X-axis.

Although the fins include the connection fins 5, the parallel fins 6, and the connection fins 5 disposed in the three sections in this order from bottom (the base section 2 includes a first region, a second region, and a first region) in FIGS. 3(a) and 3(b), they may include the parallel fins 6, the connection fins 5, and the parallel fins 6 disposed in the three sections in this order from bottom (the base section 2 includes a second region, a first region, and a second region). The number of sections is not limited to three and four or more sections of the connection fins 5 and the parallel fins 6 may be disposed alternately. The connection fins 5 and the parallel fins 6 do not necessarily have to be disposed alternately. The connection fins 5 may be disposed successively at intervals and then the parallel fins 6 may be disposed successively at intervals.

Embodiment 3

Figure 4:
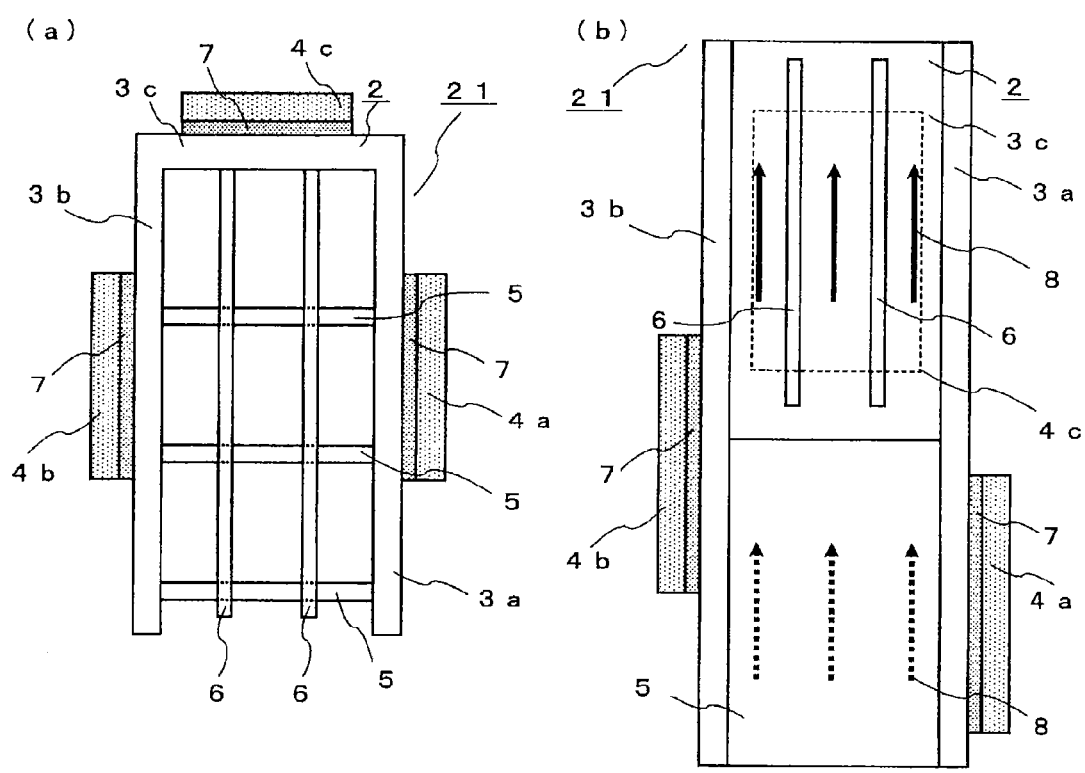
FIGS. 4(a) and 4(b) are plan views of a heat sink according to Embodiment 3 of the present invention.

FIG. 4 is a plan view of a heat sink 21 according to Embodiment 3 of the present invention, wherein FIG. 4(a) is a view in a direction of a Z-axis (from above) in FIG. 1 and FIG. 4(b) is a view in a direction of a Y-axis in FIG. 1, respectively. In FIGS. 4(a) and 4(b), the same reference numerals as those in FIGS. 1 and 2 designate the same or corresponding portions.

As shown in FIGS. 4(a) and 4(b), the heat sink 21 according to Embodiment 3 has a structure in which a heat generating component 4c is further mounted to an outer side of a third base plate 3c with a heat conducting material 7 interposed therebetween in the heat sink 1 in Embodiment 1.

As described in Embodiment 1, by employing the die casting, it is possible to mold the third base plate 3c integrally with the first base plate 3a and the second base plate 3b by using material such as aluminum having excellent heat conductivity and the third base plate 3c also attains a satisfactory heat-releasing characteristic. Therefore, it is possible to mount the heat generating component 4c also to the third base plate 3c.

The heat generating components may be disposed at the same heights (positions in the direction of the Z-axis) or the heat generating components 4a, 4b, and 4c may be disposed at different heights as shown in FIG. 4. By disposing the heat generating components at different heights, transfer routes of heat generated by the respective heat generating components 3a, 3b, and 3c to heat-releasing surfaces of the fins become short, which enhances the cooling efficiency and improves the heat-releasing characteristic. For example, in Embodiment 1 (FIG. 2), the heat generating components 4a and 4b are mounted at the same heights near the upper portions of the connection fins 5. In this case, the heat generated from the heat generating component 4a or 4b is transported to the lower portions of the connection fins 5 through the first or second base plate 3a or 3b by heat conduction. On the other hand, in Embodiment 3 (FIG. 4), while the position of the heat generating component 4b is the same as that in Embodiment 1, the heat generating component 4a is disposed at a lower position than the heat generating component 4b. Therefore, the lower portions of the connection fins 5 mainly release the heat from the heat generating component 4a while the upper portions of the connection fins 5 mainly release the heat from the heat generating component 4b. As a result, it is possible to transfer the heat to the heat-releasing surfaces of the connection fins through the shorter routes to thereby further enhance the heat-releasing efficiency.

Embodiment 4

Figure 5:
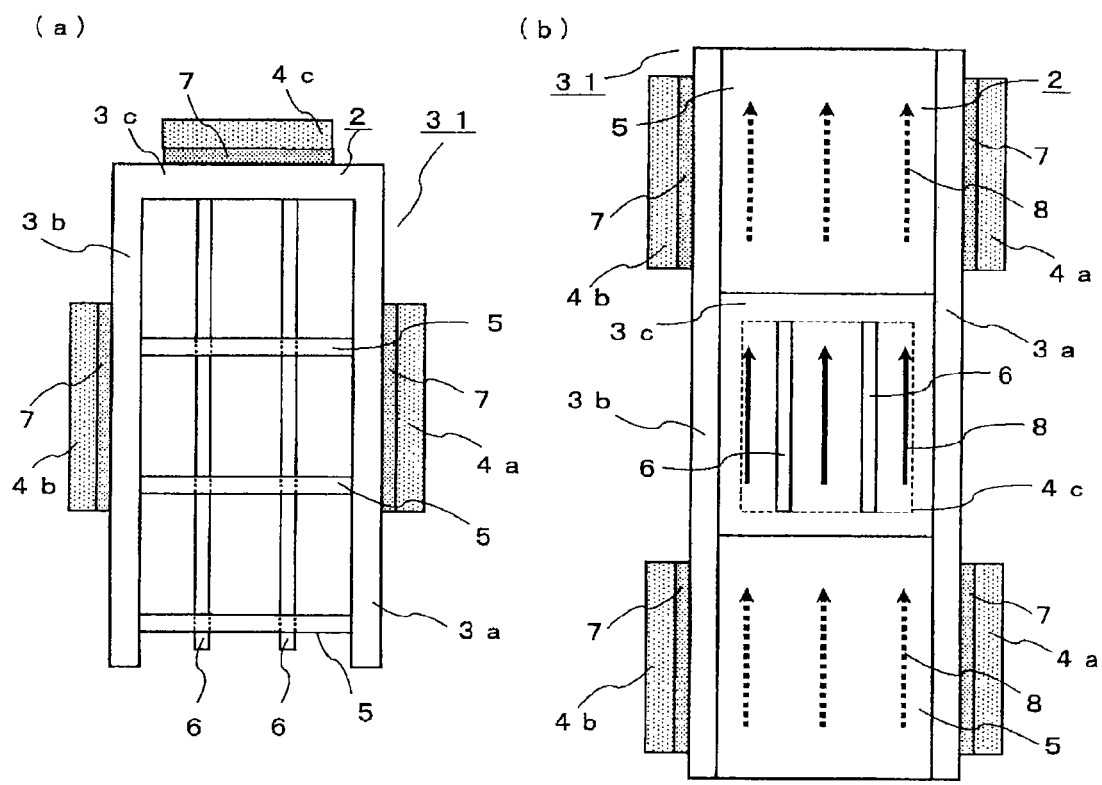
FIGS. 5(a) and 5(b) are plan views of a heat sink according to Embodiment 4 of the present invention.

FIG. 5 is a plan view of a heat sink 31 according to Embodiment 4 of the present invention, wherein FIG. 5(a) is a view in a direction of a Z-axis (from above) in FIG. 1 and FIG. 5(b) is a view in a direction of a Y-axis in FIG. 1, respectively. In FIG. 5, the same reference numerals as those in FIGS. 1 and 2 designate the same or corresponding portions.

The heat sink 31 according to Embodiment 4 has a structure in which a heat generating component 4c is further mounted to an outer side of a third base plate 3c with a heat conducting material 7 interposed therebetween in the heat sink 11 in Embodiment 2.

When heat generating components 4a and 4b are provided to first and second base plates 3a and 3b, the heat generating components 4a and 4b are preferably mounted near junctions of the first base plate 3a and the second base plate 3b with connection fins 5. When the heat generating component 4c is provided to the third base plate 3c, the heat generating component 4c is preferably mounted near junctions of the third base plate 3c with the parallel fins 6. In this way, it is possible to efficiently transfer heat generated from the heat generating components 4a, 4b, and 4c to the connection fins 5 and the parallel fins 6 to thereby improve the heat-releasing characteristic.

Although the heat-releasing fins include the connection fins 5, the parallel fins 6, and the connection fins 5 disposed in the three sections in this order from bottom in FIGS. 5(a) and 5(b) as in Embodiment 2, they may include the parallel fins 6, the connection fins 5, and the parallel fins 6 disposed in the three sections in this order from bottom. The number of sections is not limited to three and four or more sections of the connection fins 5 and the parallel fins 6 may be disposed alternately. The connection fins 5 and the parallel fins 6 do not necessarily have to be disposed alternately. The connection fins 5 may be disposed successively at intervals and then the parallel fins 6 may be disposed successively at intervals.

Embodiment 5

Figure 6:
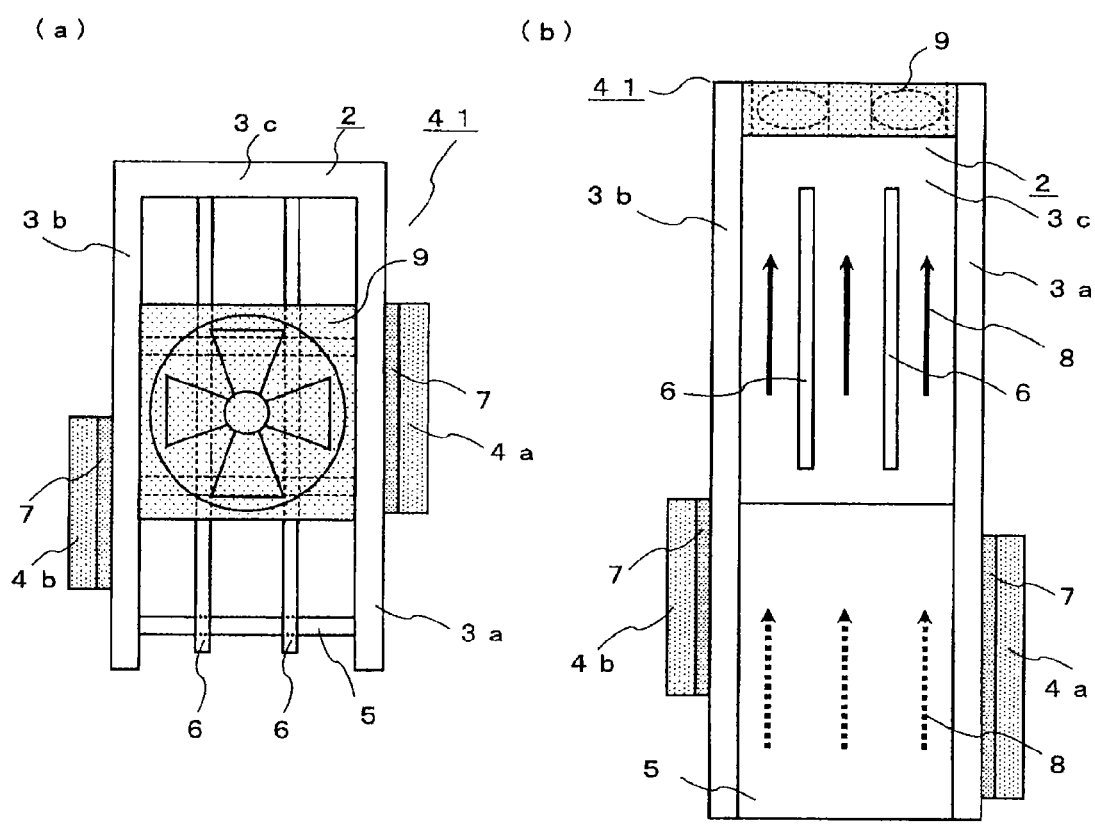
FIGS. 6(a) and 6(b) are plan views of a heat sink according to Embodiment 5 of the present invention.

FIG. 6 is a plan view of a heat sink 41 according to Embodiment 5 of the present invention, wherein FIG. 6(a) is a view in a direction of a Z-axis (from above) in FIG. 1 and FIG. 6(b) is a view in a direction of a Y-axis in FIG. 1, respectively. In FIG. 6, the same reference numerals as those in FIGS. 1 and 2 designate the same or corresponding portions.

The heat sink 41 according to Embodiment 5 has a structure in which a cooling fan 9 is provided near an upper outlet in the heat sink 1 in Embodiment 1. By moving air upward by using such a cooling fan 9, cooling air 8 flows in from a lower opening portion of the heat sink 1 and cools connection fins 5 and parallel fins 6 to cool heat generating components 4a and 4b. Especially, by forcibly circulating the cooling air 8 by using the cooling fan 9, it is possible to enhance the cooling efficiency of the heat generating components 4a and 4b as compared with the case in which the cooling air 8 is generated by heating the air.

Moreover, because the connection fins 5 and the parallel fins 6 are disposed so that their normals are orthogonal to each other, when the cooling fan 9 is provided, it is possible to obtain anterior border effect with small flow resistance to improve a heat-releasing characteristic as in Embodiment 1.

Although the cooling fan 9 is provided to the upper portion to cause the air to flow upward in FIG. 6, the cooling fan 9 may be oriented in an opposite direction to cause the air to flow downward so that the air is blown into the heat sink 41 from above. It is also possible to provide the cooling fan 9 to a lower side of the heat sink 41.

Although the cooling fan 9 is provided to the heat sink having the connection fins 5 and the parallel fins 6 disposed in the two sections in FIG. 6, the cooling fan 9 may be provided to the heat sink having the fins disposed in the three sections as in FIGS. 3 and 5 and the cooling fan 9 may be provided to a heat sink having fins disposed in four or more sections.

It is possible to adjust operating speed of the cooling fan 9 according to amounts of heat generation by the heat generating components. If the amounts of heat generation are small, the cooling fan 9 may be stopped to carry out natural cooling.

Embodiment 6

Figure 7:
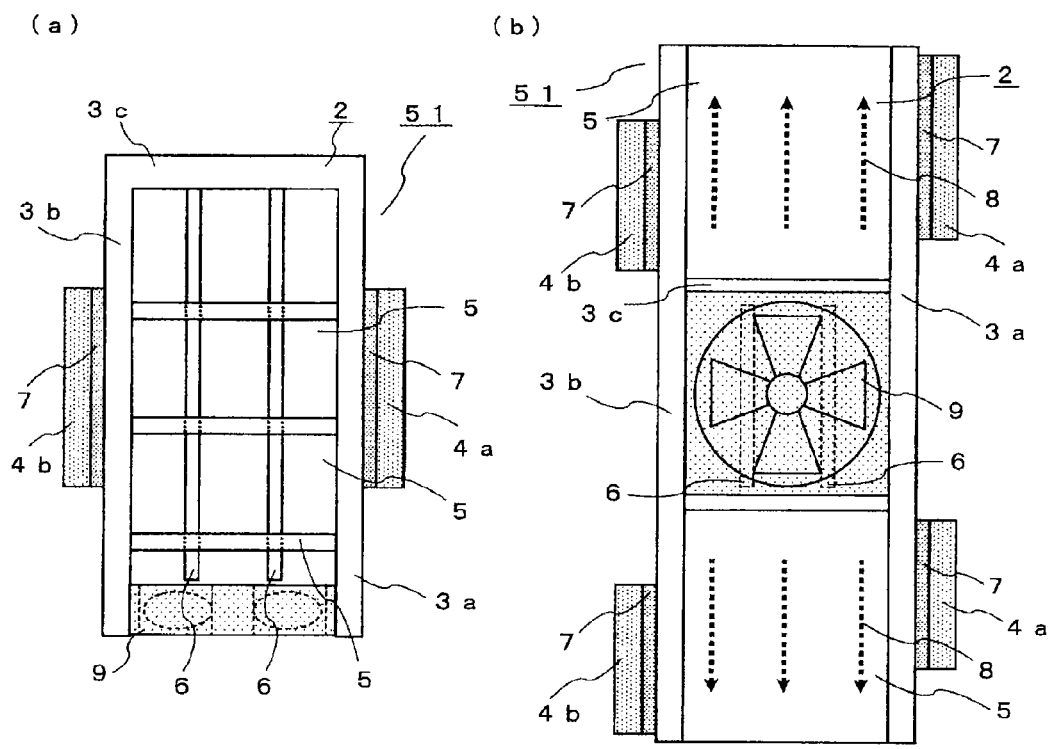
FIGS. 7(a) and 7(b) are plan views of a heat sink according to Embodiment 6 of the present invention.

FIG. 7 is a plan view of a heat sink 51 according to Embodiment 6 of the present invention, wherein FIG. 7(a) is a view in a direction of a Z-axis (from above) in FIG. 1 and FIG. 7(b) is a view in a direction of a Y-axis in FIG. 1, respectively. In FIG. 7, the same reference numerals as those in FIGS. 1 and 2 designate the same or corresponding portions.

The heat sink 51 according to Embodiment 6 has a structure in which a cooling fan 9 is provided to a side surface (a side surface facing the third base plate 3c) of a portion (a second region), provided with the parallel fins 6, of the heat sink (FIG. 5) in Embodiment 4. In this structure, when the cooling fan 9 causes air to flow toward an inside of the heat sink 1, cooling air 8 flows from the parallel fins 6 toward the third base plate 3c, then is divided into upward and downward directions to flow between the connection fins 5 as shown in FIG. 7(b), and is exhausted from upper and lower opening portions while cooling heat generating components 4a and 4b in this process. Especially, because the cooling air 8 is substantially evenly divided into the upward and downward opposite directions, it is possible to substantially equally cool the heat generating components 4a and 4b disposed in upper and lower portions.

It is also possible to provide a heat generating component 4c to the third base plate 3c. Especially, when the heat generating component 4c generates a larger amount of heat than the other heat generating components 4a and 4b, it is possible to improve a heat-releasing characteristic by mounting the heat generating component 4c at about the same height (a position facing the cooling fan 9) as the cooling fan 9 on the third base plate 3c.

By disposing the cooling fan 9 on the side surface facing the third base plate 3c as shown in FIG. 7, it is possible to carry out cooling with higher efficiency, because the cooling fan 9 does not form flow resistance to natural cooling even when the cooling fan 9 is stopped.

Although the cooling fan 9 is provided to draw the air into the heat sink 51 in FIG. 7, the cooling fan 9 may be provided reversely to discharge the air from the inside of the heat sink 51.

Embodiment 7

Figure 8:
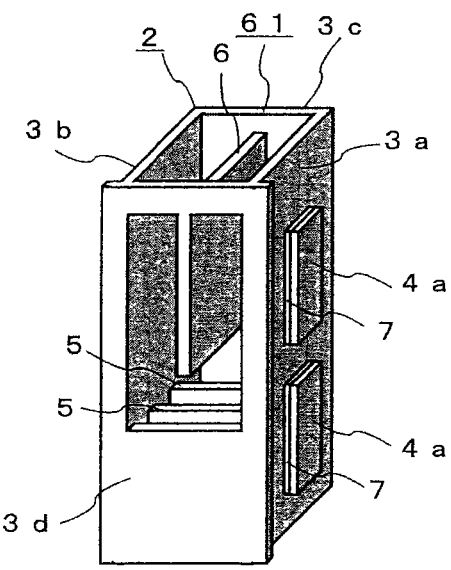
FIG. 8 is a perspective view of a heat sink according to Embodiment 7 of the present invention.

FIG. 8 is a perspective view of a heat sink 61 according to Embodiment 7 of the present invention. In FIG. 8, the same reference numerals as those in FIGS. 1 and 2 designate the same or corresponding portions.

The heat sink 61 according to Embodiment 7 has a structure in which a fourth base plate 3d is provided to connect tip ends of the first base plate 3a and the second base plate 3b in the heat sink (FIG. 2) in Embodiment 1. In this structure, by mounting the fourth base plate 3d to a wall surface in mounting the heat sink 61 to the wall surface, a contact area is increased, thermal contact resistance is reduced, and the heat-releasing characteristic can be improved. Moreover, by extending opposite ends of the fourth base plate 3d further from the first base plate 3a and the second base plate 3b as shown in FIG. 8, the heat sink 61 can be easily mounted to the wall surface by using screws or the like. Furthermore, it is possible to provide a heat generating component to an outer surface of the fourth base plate 3d.

By connecting the tip end portions of the fourth base plate 3d and the parallel fin 6, it is possible to transport heat from the fourth base plate 3d to the tip end portion of the parallel fin 6 to thereby improve a heat-releasing characteristic of the parallel fin 6. Although a hole is formed in a portion of the fourth base plate 3d corresponding to the parallel fin 6 in FIG. 8, the hole may be omitted and the heat sink 61 may be formed in a box shape.

Embodiment 8

Figure 9:
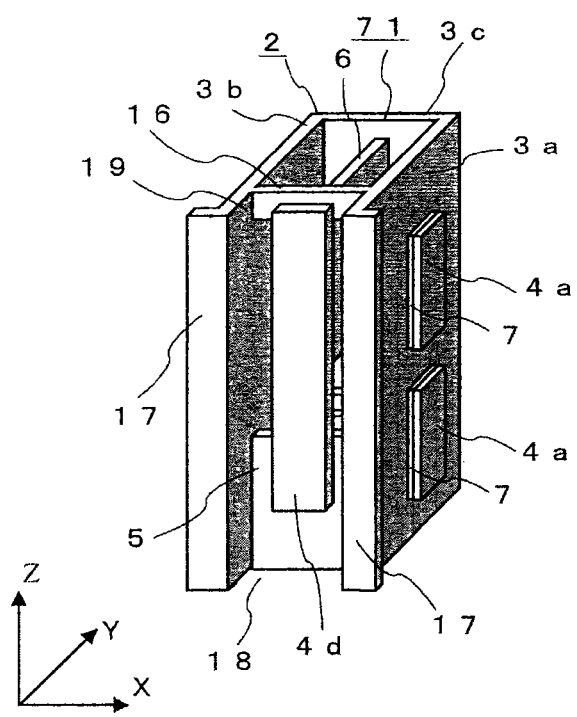
FIG. 9 is a perspective view of a heat sink according to Embodiment 8 of the present invention.

FIG. 9 is a perspective view of a heat sink 71 according to Embodiment 8 of the present invention. In FIG. 9, the same reference numerals as those in FIGS. 1 and 2 designate the same or corresponding portions.

The heat sink 71 according to Embodiment 8 has a structure in which a coupling plate 16 for coupling tip ends of the first base plate 3a, the second base plate 3b, and the parallel fin 6 is provided in the heat sink (FIG. 2) in Embodiment 1. Moreover, fixing plates 17 are provided to the tip ends of the first base plate 3a and the second base plate 3b so that the fixing plates 17 can be mounted to the wall surface by using screws or the like. A heat generating component 4d is mounted to be in close contact with the coupling plate 16 and the front connection fin 5.

In this structure, because the tip end portions of the first base plate 3a, the second base plate 3b, and the parallel fin 6 are connected by the coupling plate 16, it is possible to transport heat from the first base plate 3a and the second base plate 3b to the tip end portion of the parallel fin 6 to improve a heat-releasing characteristic of the parallel fin 6. If the heat generating component 4d is provided and the fixing plates 17 are mounted to the wall surface, air flows in from a ventilating inlet 18 at a bottom and is exhausted from a ventilating outlet 19 and therefore it is possible to efficiently cool the heat generating component 4d. Because the tip end portion of the parallel fin 6 is also open, the air flowing out from between the connection fins 5 can cool the heat generating component 4d.

The heat sink 71 as shown in FIG. 9 can be produced by die casting by using four partial metal molds. To put it concretely, to produce the heat sink 71 shown in FIG. 9, for example, casting is carried out by using the metal molds in directions of +Y, −Y, +Z, and −Z. In a casting step, holes for mounting components and the like are formed simultaneously. After the casting, by pulling off the four metal molds in the directions of +Y, −Y, +Z, and −Z, respectively, it is possible to take out the heat sink 71. At this time, holes for mounting the components may be formed in a direction of X by using five or more partial metal molds.

Embodiment 9

Figure 10:
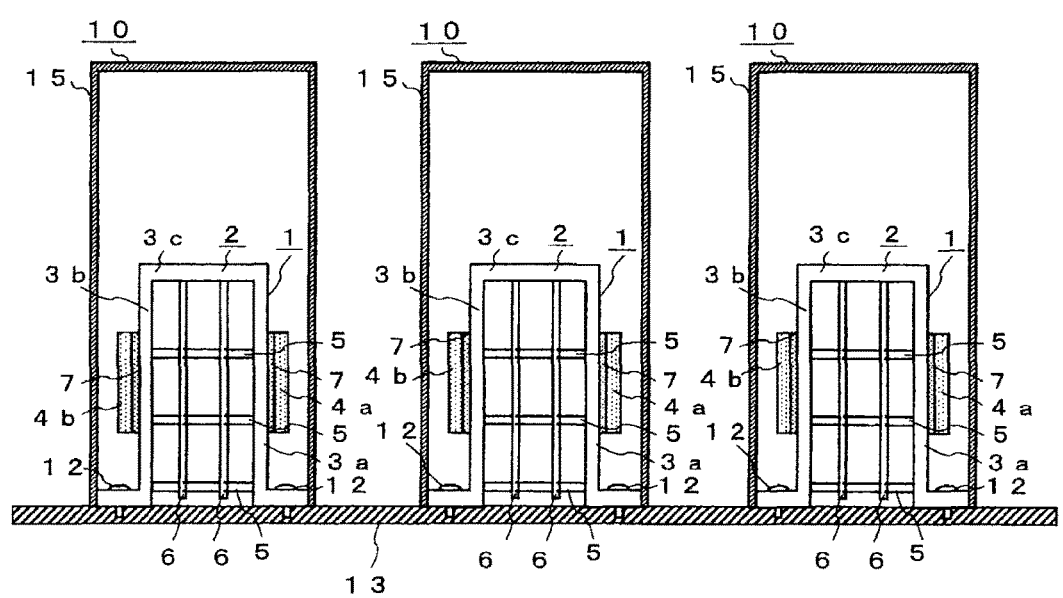
FIG. 10 is a plan view of an electronic device according to Embodiment 9 of the present invention.

FIG. 10 is a plan sectional view of electronic devices 10 according to Embodiment 9 of the present invention and using the heat sinks 1 and seen from above (in a direction of Z in FIG. 1). In FIG. 10, the same reference numerals as those in FIGS. 1 and 2 designate the same or corresponding portions.

In Embodiment 9, the plurality of electronic devices 10 are fixed to a side surface of a mounting plate 13. The mounting plate 13 corresponds to an inner wall of a control panel, for example. Each of the electronic devices 10 includes the heat sink 1 shown in Embodiment 1, for example, and a case 15 disposed to cover the heat sink 1. Tip end portions of a first base plate 3a and a second base plate 3b of the heat sink 1 are bent in L shapes and are fastened to the mounting plate 13 with screws 12.

In the heat sink 1 according to the present invention, because a base section 2 has an angular U-shaped structure integrally formed by die casting, for example, and has high rigidity, the base section 2 can be fixed to the mounting plate 13 with the screws 12.

Because the heat sink 1 is thermally connected to the mounting plate 13, heat generated by the heat generating components 4a and 4b is transferred to the mounting plate 13 and is released from the mounting plate 13 into air, which improves a heat-releasing characteristic.

Although the heat sink 1 according to Embodiment 1 is applied to the electronic device 10 in the case described in FIG. 10, the heat sinks according to Embodiments 2 to 8 may be used. Although the tip end portions of the first base plate 3a and the second base plate 3b are formed into L shapes, they maybe formed into T shapes, for example. By forming them into T shapes, contact areas between the base section 2 and the mounting plate 13 increase and thermal contact resistance reduces to further improve the heat-releasing characteristic.

Embodiment 10

Figure 11:
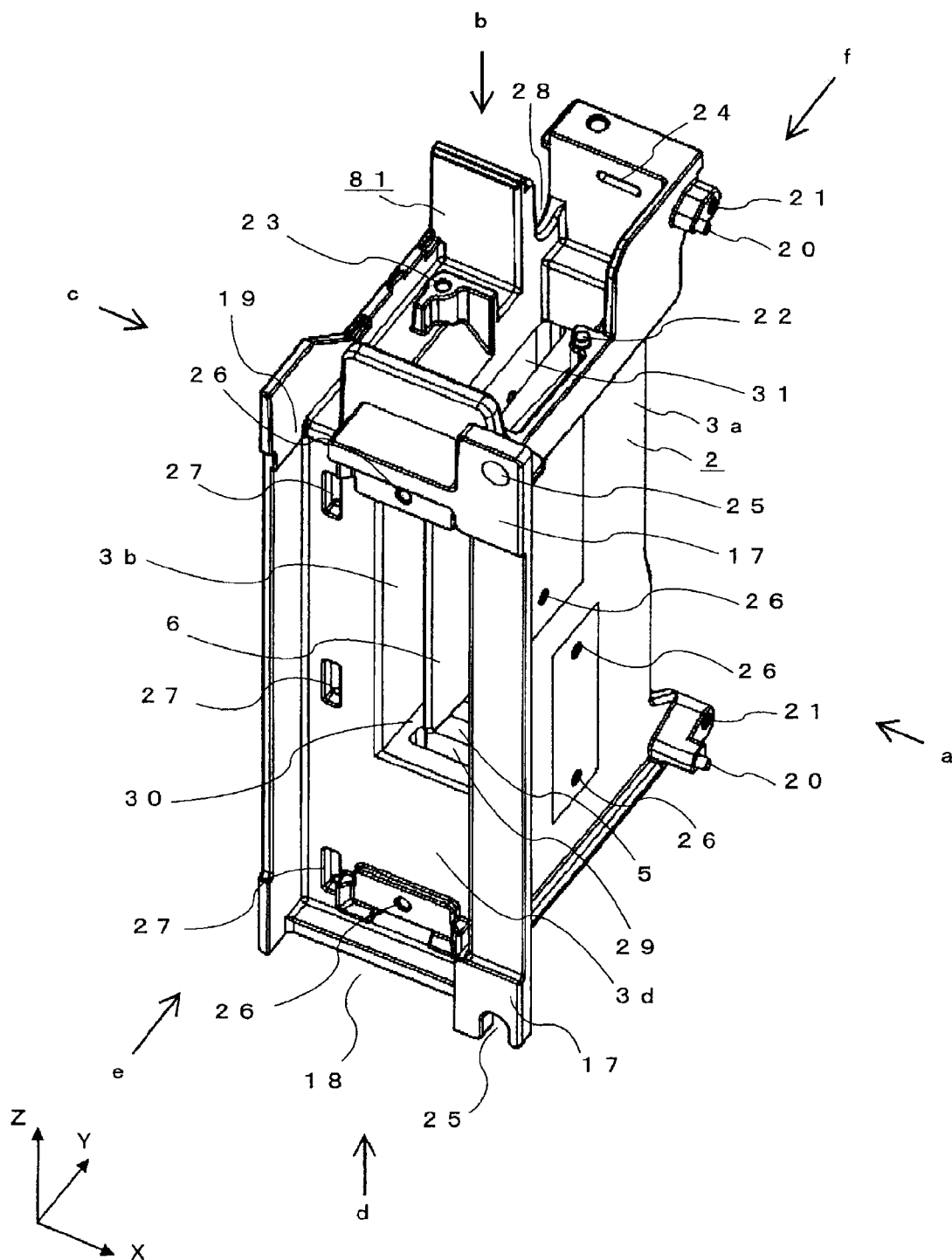
FIG. 11 is a perspective view of a heat sink according to Embodiment 10 of the present invention.
Figure 12A:
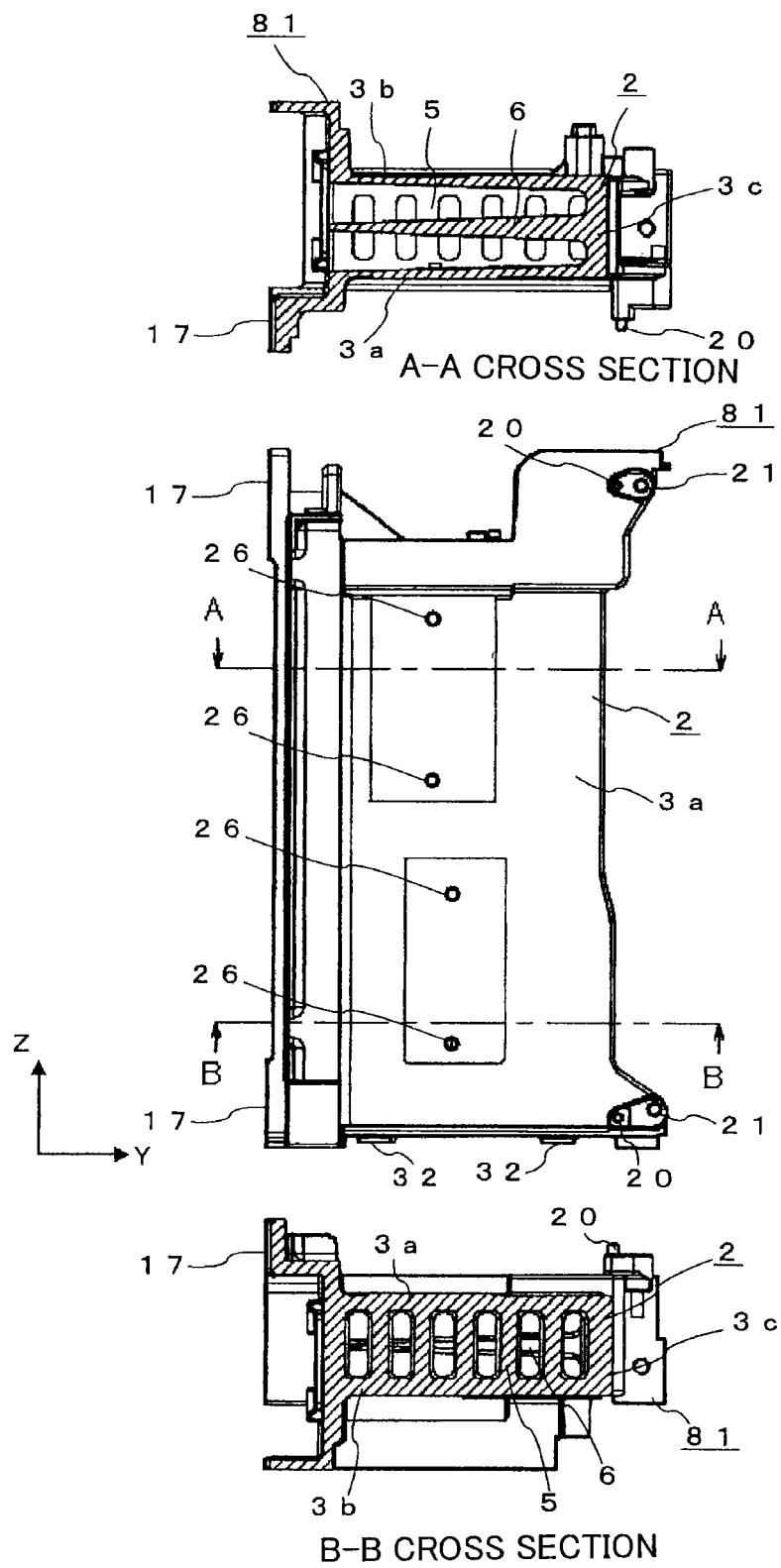
FIG. 12(a) is a plan view of the heat sink according to Embodiment 10 of the present invention.
Figure 12B:
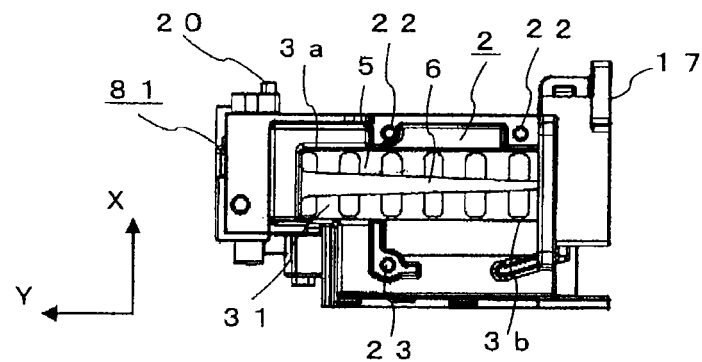
FIG. 12(b) is a plan view of the heat sink according to Embodiment 10 of the present invention.
Figure 12C:
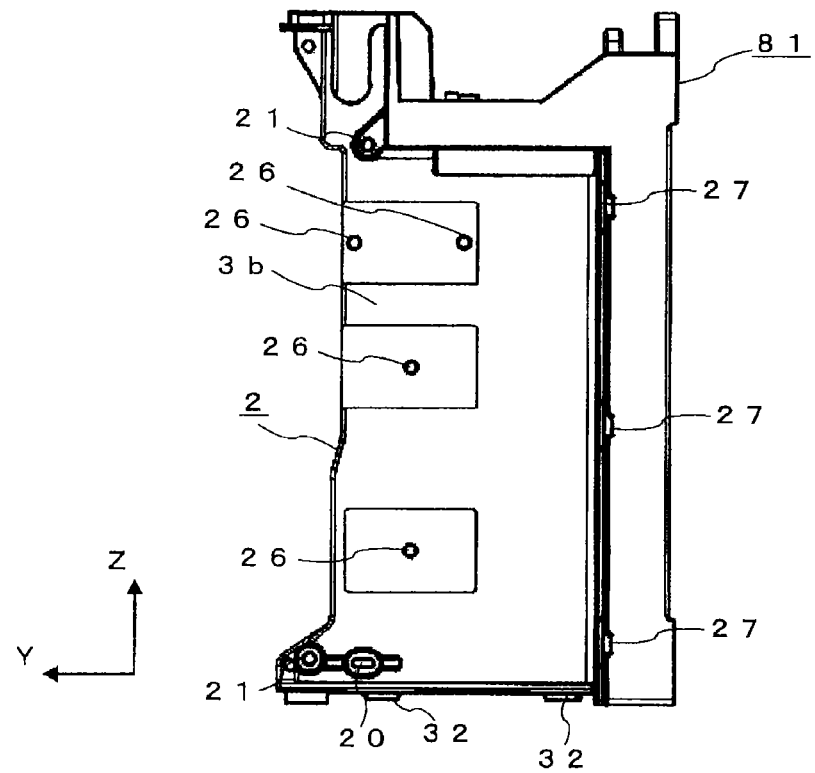
FIG. 12(c) is a plan view of the heat sink according to Embodiment 10 of the present invention.
Figure 12D:
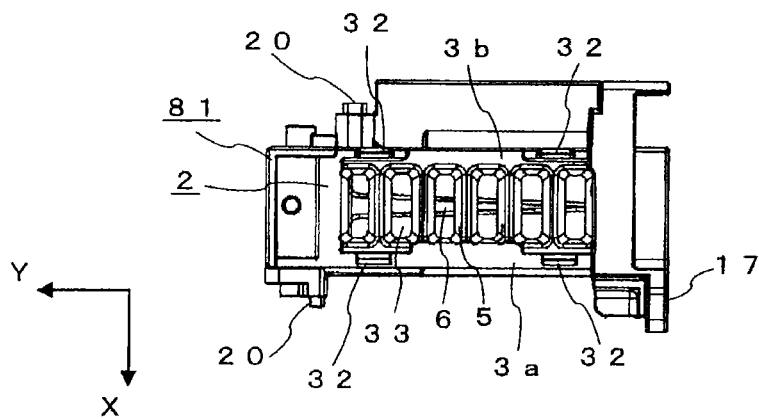
FIG. 12(d) is a plan view of the heat sink according to Embodiment 10 of the present invention.
Figure 12E:
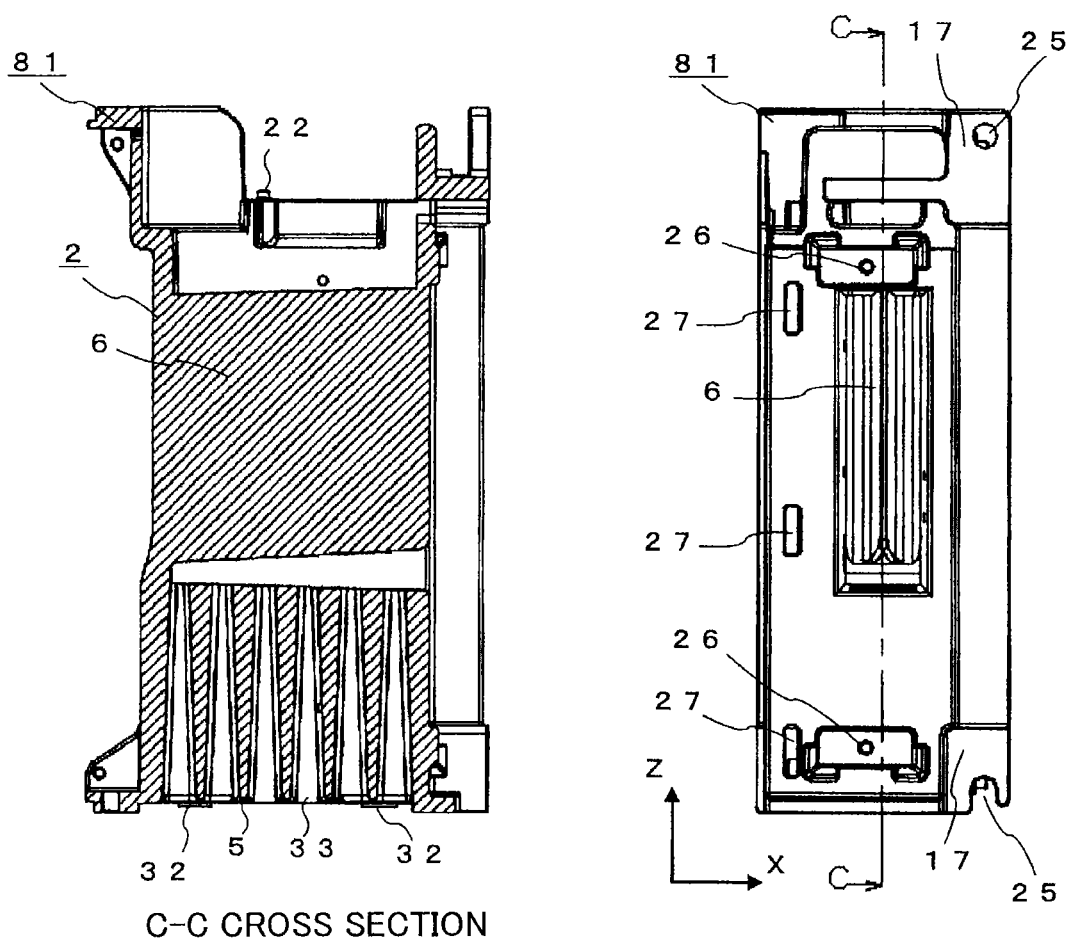
FIG. 12(e) is a plan view of the heat sink according to Embodiment 10 of the present invention.
Figure 12F:
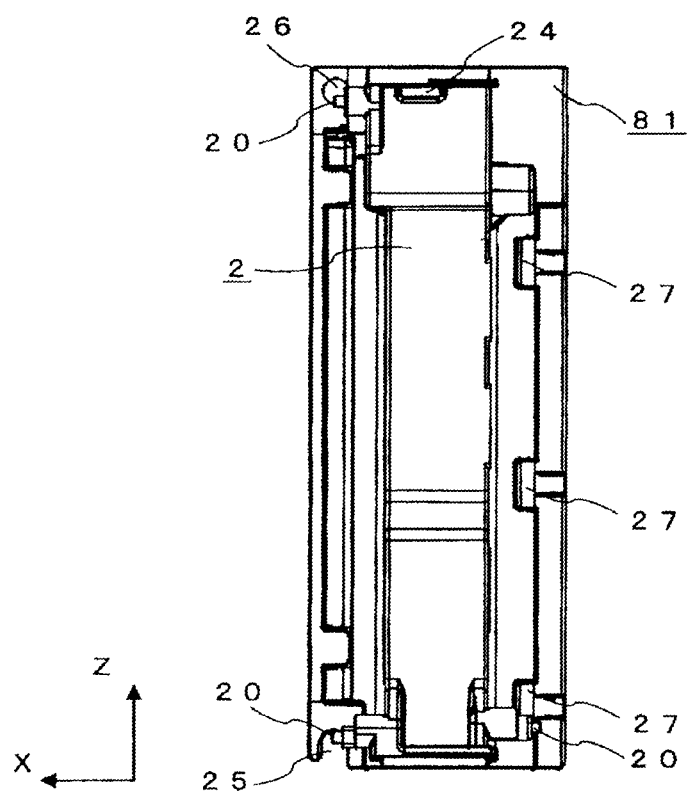
FIG. 12(f) is a plan view of the heat sink according to Embodiment 10 of the present invention.

FIG. 11 is a perspective view of a heat sink according to Embodiment 10 of the present invention, in which the entire heat sink is designated by a reference numeral 81. FIGS. 12(a) to 12(f) are plan views of the heat sink 81, wherein FIG. 12(a) is a view of a YZ plane in FIG. 11 from a direction of +X (showing sections along lines A-A and B-B as well), FIG. 12(b) is a view of an XY plane in FIG. 11 from a direction of +Z, FIG. 12(c) is a view of a YZ plane in FIG. 11 from a direction of −X, FIG. 12(d) is a view of an XY plane in FIG. 11 from a direction of −Z, FIG. 12(e) is a view of an XZ plane in FIG. 11 from a direction of −Y (showing a section along line C-C as well), and FIG. 12(f) is a view of an XZ plane in FIG. 11 from a direction of +Y.

As shown in FIG. 11, the heat sink 81 has a base section 2 made of aluminum, for example. The base section 2 includes a first base plate 3a and a second base plate 3b disposed so as to face each other in a parallel manner and a third base plate 3c and a fourth base plate 3d connecting the two base plates.

Inside the base section 2 (a first region), connection fins 5 are provided (in XZ planes) to connect the first base plate 3a and the second base plate 3b facing each other and to be parallel to the third base plate 3c. Moreover, a parallel fin 6 is provided to the third base plate 3c of the base section 2 (a second region) in such a direction (in a YZ plane) as to be parallel to the first base plate 3a and the second base plate 3b and orthogonal to the connection fins 5. The connection fins 5 and the parallel fin 6 are made of aluminum, for example.

In the first base plate 3a and the second base plate 3b, board positioning bosses 20 and board fixing screw holes 21 are formed. In an upper portion of the base section 2, a fan positioning boss 22, a fan fixing screw hole 23, and a fan cover lug fixing hole 24, and a wiring passage 28 are formed.

Fixing plates 17 are provided to a tip end of the first base plate 3a and heat sink fixing holes 25 are formed in the fixing plates 17. Onto outer sides of the first base plate 3a, the second base plate 3b, and the fourth base plate 3d, heat generating components are fastened with screws screwed into heat generating component mounting screw holes 26. In the fourth base plate 3d, resin cover fixing holes 27 are formed. On the first base plate 3a and the second base plate 3b, resin cover fixing lugs 32 are provided.

In this heat sink 81, heat generated by the heat generating components is transferred from the base section 2 to the connection fins 5 or the parallel fin 6. Air around the connection fins 5 and the parallel fin 6 is warmed by the transferred heat and cooling air flowing upward from below flows in from a connection fin inlet 33 due to an air density difference. With this cooling air, the base section 2 and the connection fins 5 are cooled. The cooling air flowing out from a connection fin outlet 29 flows into a parallel fin inlet 30 to cool the base section 2 and the parallel fin 6 and cool the heat generating components while flowing out from a parallel fin outlet 31.

Because the parallel fin 6 is provided above the connection fins 5 in the heat sink 81, it is possible to improve a heat-releasing characteristic by anterior border effect at the parallel fin inlet 30 (a portion below the parallel fin 6).

In the heat sink 81, the connection fins 5 and the parallel fin 6 are disposed so that their normals are orthogonal to each other and therefore an air inlet width from a connection fin outlet 29 into the parallel fin inlet 30 is large. Moreover, because not only a high-speed portion but also a low-speed portion of the air flowing out of the preceding fins (connection fins 5) collide with a lower surface of the subsequent fin (parallel fin 6), it is possible to reduce flow resistance.

In the structure in which the two heat sinks are simply opposed to each other and one ends of them are connected as in the prior art (e.g., Patent Document 1), if differences between the amounts of heat generation of the plurality of mounted heat generating components are large, the heat generated by the heat generating component which generates the large amount of heat needs to be transferred through a connection plate to the opposed base plates and fins through long heat transfer routes, which reduces cooling efficiency.

On the other hand, in the heat sink 81 according to Embodiment 10, the first base plate 3a, the second base plate 3b, and the fourth base plate 3d mounted with the heat generating components are not only connected directly but also thermally connected by the third base plate 3c as well as by the connection fins 5 and the heat transfer routes are shorter than those in the prior-art structure. Therefore, if the differences between the amounts of heat generation of the respective heat generating components are large, heat is automatically balanced by heat diffusion and it is possible to improve the heat-releasing characteristic.

For example, if the amount of heat generation of the heat generating component mounted to the first base plate 3a is large, larger areas of the third base plate 3c and the connection fins 5 contribute to release of the heat of the heat generating component and smaller areas of them contribute to release of the heat of the heat generating component mounted to the second base plate 3b. As a result, the temperatures are balanced and it is possible to suppress temperature rise of the heat generating component mounted to the first base plate 3a.

Because the heat sink fixing holes 25 are formed in the heat sink 81, the fixing plates 17 can be brought into close contact with and mounted to an inner wall or the like of the control panel. At this time, the heat of the heat generating components can be transferred to the mounting plate and released and therefore it is possible to improve the heat-releasing characteristic. A ventilating inlet 18 and a ventilating outlet 19 are formed between the mounting plate and the fourth base plate 3d and therefore it is possible to improve the heat-releasing characteristic of the heat generating component mounted to the fourth base plate 3d. Because a portion of the fourth base plate 3d corresponding to a tip end portion of the parallel fin 6 is open, cooling air flowing out from the connection fin outlet 29 can cool the heat generating component mounted to the fourth base plate 3d.

Because the board positioning bosses 20 and the board fixing screw holes are formed in the heat sink 81, it is possible to easily position and fix the board in assembling a product for which the heat sink 81 is used. Moreover, because the fan positioning boss 22 and the fan fixing screw hole 23 are provided as well, it is possible to easily mount a fan, which reduces a production cost.

Because the fan cover lug fixing hole 24, the resin cover fixing holes 27, and the resin cover fixing lugs 32 are provided to the heat sink 81, it is possible to mount a resin cover and a fan cover to the heat sink 81 with single touches. Because portions to be fastened by screwing can be reduced, it is possible to reduce the production cost.

The wiring passage 28 is formed in the upper portion of the heat sink 81 and therefore wires for the fan and the heat generating bodies mounted outside can be routed into the case.

The heat sink 81 according to Embodiment 10 can be produced by die casting in which four or more partial casting molds are pulled off and composing elements can be formed simultaneously in multiple directions, which makes the production process easy. If the heat sink 81 is produced by die casting, the four base plates 3a, 3b, 3c, and 3d are formed integrally and therefore it is possible to maintain a clearance between the two base plates 3a and 3b with high rigidity. By sandwiching the partial casting mold to be pulled off from a direction of −Y in FIG. 11 between the partial casting molds to be pulled off in directions of +Z and −Z, it is possible to form a space between the connection fins 5 and the parallel fin 6 and burrs can be easily removed if they are formed in the production process of the die casting.

The invention claimed is:
1. A heat sink in which heat-releasing fins are provided to a base section, comprising:
   the base section including:
   a) a first base plate which has an outer surface and an inner surface, a first heat generating component mounted on the outer surface of the first base plate,
   b) a second base plate which is disposed so as to face the first base plate in a parallel manner, has an outer surface and an inner surface, a second heat generating component mounted on the outer surface of the second base plate, and
   c) a third base plate which is disposed so as to be perpendicular to the first base plate and the second base plate, secures the first base plate and the second base plate along junction lines, and has an outer surface and an inner surface,
   the base section further including at least one first region and at least one second region which are arranged in a direction of the junction lines, each of the first region and the second region surrounded by the first base plate, the third base plate and the second base plate;
   a connection fin disposed extending between the inner surfaces of the first base plate and the second base plate such that one tip end portion of the connection fin contacts the inner surface of the first base plate and the other tip end portion of the connection fin contacts the inner surface of the second base plate, the connection fin being parallel to the third base plate; and
   a parallel fin disposed so as to extend from the inner surface of the third base plate to be parallel to the first base plate such that the parallel fin overlaps the connection fin when viewed in the direction of the junction lines to form a straight cooling air path adjacent to the connection fin and the parallel fin in the direction of the junction lines,
   wherein the first region includes only a plurality of the connection fins and the second region includes only a plurality of the parallel fins.
2. The heat sink according to claim 1, wherein the connection fin and the parallel fin are orthogonal to each other when seen in the direction of the junction lines.
3. The heat sink according to claim 1, wherein the base section is in an angular U shape when seen in the direction of the junction lines.
4. The heat sink according to claim 1, further comprising:
   a fourth base plate provided to tip end portions of the first base plate and the second base plate to be parallel to the third base plate.
5. A heat sink in which heat-releasing fins are provided to a base section, comprising:
   the base section including:
   a) a first base plate which has an outer surface and an inner surface, a first heat generating component to be mounted on the outer surface of the first base plate,
   b) a second base plate which is disposed so as to face the first base plate in a parallel manner, has an outer surface and an inner surface, a second heat generating component to be mounted on the outer surface of the second base plate, and
   c) a third base plate which is disposed so as to be perpendicular to the first base plate and the second base plate, secures the first base plate and the second base plate along junction lines, and has an outer surface and an inner surface,
   the base section further including at least one first region and at least one second region which are arranged in a direction of the junction lines;
   a connection fin disposed in the first region extending between the inner surfaces of the first base plate and the second base plate such that one tip end portion of the connection fin contacts the inner surface of the first base plate and the other tip end portion of the connection fin contacts the inner surface of the second base plate, the connection fin being parallel to the third base plate;
   a parallel fin disposed in the second region so as to extend from the inner surface of the third base plate to be parallel to the first base plate such that the parallel fin overlaps the connection fin when viewed in the direction of the junction lines to form a straight cooling air path adjacent to the connection fin and the parallel fin in the direction of the junction lines; and
   a coupling plate that couples tip end portions of the first base plate and the second base plate and a tip end portion of the parallel fin.
6. The heat sink according to claim 1, wherein at least one of the following is satisfied:
   the base section includes at least two second regions provided so that the at least one first region is sandwiched between the at least two second regions and
   the base section includes at least two first regions provided so that the at least one second region is sandwiched between the at least two first regions.
7. The heat sink according to claim 1, wherein a fan is provided to an end portion of the base section in the direction of the junction lines.
8. The heat sink according to claim 1, wherein a fan is provided to an end portion of the base section in a direction perpendicular to the junction lines so as to face the third base plate with the parallel fin interposed therebetween.
9. The heat sink according to claim 1, further comprising:
   a board positioning boss and a board fixing screw hole provided on the first base plate and the second base plate;
   a fan positioning boss, a fan fixing screw hole, a fan cover lug fixing hole and a wiring passage provided on an upper portion of the base section;
   a fixing plate provided to a tip end of the first base plate;
   a heat sink fixing hole provided in the fixing plate;
   a heat generating component mounting screw hole provided in the first base plate, the second base plate and the fourth base plate;
   a resin cover fixing hole provided in the fourth base plate; and
   a resin cover fixing lug provided on the first base plate and the second base plate.
10. The heat sink according to claim 1, wherein an air inlet width of the second region from an outlet of the first region into the second region is substantially similar to an air outlet width of the first region from the outlet of the first region into the second region.
11. A heat sink in which heat-releasing fins are provided to a base section, comprising:
   the base section including:
   a) a first base plate which has an outer surface and an inner surface, a first heat generating component to be mounted on the outer surface of the first base plate,
   b) a second base plate which is disposed so as to face the first base plate in a parallel manner, has an outer surface and an inner surface, a second heat generating component to be mounted on the outer surface of the second base plate, and c) a third base plate which is disposed so as to be perpendicular to the first base plate and the second base plate, secures the first base plate and the second base plate along junction lines, and has an outer surface and an inner surface, the base section further including at least one first region and at least one second region which are arranged in a direction of the junction lines;

a connection fin disposed in the first region connecting the inner surfaces of the first base plate and the second base plate and being parallel to the third base plate; and a parallel fin disposed in the second region so as to extend from the inner surface of the third base plate to be parallel to the first base plate such that the parallel fin overlaps the connection fin when viewed in the direction of the junction lines to form a straight cooling air path adjacent to the connection fin and the parallel fin in the direction of the junction lines, wherein the connection fin and the parallel fin are not in contact with each other.

\* \* \* \* \*